United States Patent
Satoh et al.

(10) Patent No.: US 8,911,600 B2
(45) Date of Patent: Dec. 16, 2014

(54) METHOD OF STORING LANTHANUM OXIDE TARGET, AND VACUUM-SEALED LANTHANUM OXIDE TARGET

(75) Inventors: Kazuyuki Satoh, Ibaraki (JP); Yoshimasa Koido, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 354 days.

(21) Appl. No.: 13/319,190

(22) PCT Filed: Oct. 5, 2010

(86) PCT No.: PCT/JP2010/067401
§ 371 (c)(1),
(2), (4) Date: Nov. 7, 2011

(87) PCT Pub. No.: WO2011/062003
PCT Pub. Date: May 26, 2011

(65) Prior Publication Data
US 2012/0045380 A1    Feb. 23, 2012

(30) Foreign Application Priority Data
Nov. 17, 2009 (JP) .................................. 2009-261788

(51) Int. Cl.
C23C 14/00 (2006.01)
C23C 14/34 (2006.01)
C04B 35/50 (2006.01)

(52) U.S. Cl.
CPC ............. *C23C 14/3407* (2013.01); *C04B 35/50* (2013.01); *C23C 14/3414* (2013.01)
USPC ............. 204/298.13; 204/298.12; 204/192.15

(58) Field of Classification Search
CPC .............................. C23C 14/08; H01J 37/3426
USPC ............................ 204/298.12, 192.15, 298.13
See application file for complete search history.

(56) References Cited

U.S. PATENT DOCUMENTS

| | | | |
|---|---|---|---|
| 6,030,514 A | 2/2000 | Dunlop et al. | |
| 6,315,873 B1 * | 11/2001 | Lowe et al. | 204/192.15 |
| 7,788,882 B2 | 9/2010 | Okabe et al. | |
| 7,871,505 B2 | 1/2011 | Nemoto et al. | |
| 2007/0131545 A1 * | 6/2007 | Okabe et al. | 204/298.12 |
| 2007/0170053 A1 * | 7/2007 | Ohashi et al. | 204/298.13 |
| 2010/0272596 A1 | 10/2010 | Takahata et al. | |
| 2011/0114481 A1 | 5/2011 | Satoh et al. | |
| 2011/0114482 A1 | 5/2011 | Satoh et al. | |
| 2011/0162322 A1 | 7/2011 | Satoh et al. | |
| 2011/0290644 A1 | 12/2011 | Tsukamoto et al. | |
| 2011/0308940 A1 | 12/2011 | Tsukamoto et al. | |
| 2013/0277214 A1 | 10/2013 | Narita et al. | |

FOREIGN PATENT DOCUMENTS

| | | |
|---|---|---|
| JP | 02-159372 A | 6/1990 |
| JP | 04-231461 A | 8/1992 |
| JP | 08-246145 A | 9/1996 |
| JP | 10-087326 A | 4/1998 |
| JP | 2001-240959 A | 9/2001 |
| JP | 2002-212718 A | 7/2002 |
| JP | 2009-127125 A | 6/2009 |
| WO | 2009/084318 A1 | 7/2009 |
| WO | 2010/050409 A1 | 5/2010 |

OTHER PUBLICATIONS

American Elements, Lanthanum Oxide Sputtering Target, Sep. 17, 2010, http://web.archive.org/web/20100917163311/http://americanelements.com/laoxst.html.*
S. Higashi et al., "PVD CVD ALD Materials for Semiconductors", Electronic Materials and Parts, vol. 48, No. 3, pp. 79-82, Mar. 2009.
E. Tokumitsu et al., "A Study on High-Dielectric-Constant Oxide Materials for MOSFET Gate Insulator Applications", The Institute of Electrical Engineers of Japan, Research Paper of Electronic Materials, vol. 6-13, pp. 37-41, Sep. 2001.
S. Higashi et al., "45nm/32nm Sedai no Handtai Seizo Shiken Sochi Handotai yo PVD CVD ALD Zairyo", Electronic Materials and Parts, vol. 48, No. 3, pp. 79-82, Mar. 2009.

* cited by examiner

*Primary Examiner* — Keith Hendricks
*Assistant Examiner* — Timon Wanga
(74) *Attorney, Agent, or Firm* — Howson & Howson LLP

(57) ABSTRACT

A method of storing a sputtering target made of lanthanum oxide, wherein a lanthanum oxide target to which a lanthanum fluoride film was formed and lanthanum oxide powder are charged in a vacuum pack with an oxygen transmission rate of 0.1 $cm^3/m^2$ per 24 h at 1 atm or less and a moisture vapor transmission rate of 0.1 $g/m^2$ per 24 h or less, and, after charging the target and the powder, the vacuum pack is subject to vacuum suction and sealing for storage. This invention aims to provide technology for enabling the long-term storage of a sputtering target in a usable state by devising the method of storing a target made of an oxide of lanthanum as a rare earth metal, and thereby inhibiting the pulverization phenomenon of the target caused by the hydration (hydroxylation) of such target due to residual air or the inclusion of air, and the pulverization phenomenon caused by the formation of carbonate.

11 Claims, 5 Drawing Sheets

Lapse of 4 months (unopened)

Lapse of 4 months - After surface cleaning

After removal     Day 2

Day 3     Day 15

Day 1 of storageDay 15 of storage

Day 15 of storage (Only GX - for comparison)

Day 1 of storage 1
(before vacuum pack)

La₂O₃ powder + after vacuum pack

After 1 month of storage

Day 1 of storage    Day 2 of storage    Day 3 of storage

Day 1 of storage    Day 2 of storage    Day 4 of storage

Day 1 of storage    Day 2 of storage    Day 4 of storage

Before vacuum pack    After vacuum pack    After lapse of 1 month

Before vacuum pack    After vacuum pack    After lapse of 1 month

METHOD OF STORING LANTHANUM OXIDE TARGET, AND VACUUM-SEALED LANTHANUM OXIDE TARGET

BACKGROUND OF THE INVENTION

The present invention relates to a method of storing a lanthanum oxide target that degrades easily due to hydroxylation, and also relates to a vacuum-sealed lanthanum oxide target.

Lanthanum as a rare earth metal is contained in the earth's crust as a mixed composite oxide. Rare-earth elements are called "rare-earth" elements because they are separated from relatively rare minerals, but they are not that rare in light of the overall earth's crust. In recent years, rare earth metals are attracting attention as an electronic material, and research and development for using rare earth metals are being promoted.

Among the rare earth metals, lanthanum (La) is attracting particular attention. To briefly introduce lanthanum, lanthanum is a white metal having an atomic number of 57 and an atomic weight of 138.9, and comprises a double hexagonal close-packed structure at normal temperature. Lanthanum has a melting point of 921° C., boiling point of 3500° C., and density of 6.15 g/cm$^3$, its surface is oxidized in the atmosphere, and gradually melts in water.

Lanthanum is soluble in hot water and acid and, although it is not ductile, it is slightly malleable. Lanthanum's resistivity is $5.70 \times 10^{-6} \Omega$ cm, and it becomes oxide ($La_2O_3$) when burned at 445° C. or higher (refer to Dictionary of Physics and Chemistry). With rare earth elements, it is generally said that compounds with the oxidation number 3 are stable, and lanthanum is also trivalent.

Lanthanum is a metal that is attracting attention as an electronic material such as a metal gate material or a High-k material. Rare earth elements other than lanthanum also have attributes that are similar to lanthanum.

A rare earth metal such as lanthanum is a material in which high purification is difficult to achieve since it is easily oxidized during the refining process. In addition, if a rare earth metal such as lanthanum is left in the atmosphere, there is a problem in that the handling thereof is difficult since it will become oxidized and discolored in a short period of time.

In recent years, thinning of a gate insulator film in the next-generation MOSFET is being demanded, but with the $SiO_2$ that has been conventionally used as the gate insulator film, the leak current will increase due to the tunnel effect, and normal operation is becoming difficult.

Thus, as a substitute for the $SiO_2$ described above, $HfO_2$, $ZrO_2$, $Al_2O_3$ and $La_2O_3$ with high dielectric constant, high thermal stability, and high energy barrier against the holes and electrons in the silicon have been proposed. In particular, among the foregoing materials, $La_2O_3$ is valued highly, and a research paper that studied its electrical properties and use as a gate insulator film in the next-generation MOSFET has been reported (refer to Non-Patent Document 1). Nevertheless, with Non-Patent Document 1, the subject of research is a La2O3 film, and it does not make any reference to the hygroscopic property and pulverization phenomenon of a lanthanum oxide target.

It could be said that rare earth metals such as lanthanum and their oxides are still on the research phase, but when studying the properties of such rare earth metal and their oxides, if a rare earth metal oxide, in particular if lanthanum oxide itself exists as a sputtering target material, it is possible to form a thin film of such lanthanum oxide on a substrate. It will also be easy to study the behavior at the interface with the silicon substrate, and additionally study the properties of a high-dielectric gate insulator film or the like by forming a rare earth metal compound, and there is also a significant advantage in that the flexibility of the target as a product will increase.

Nevertheless, even if a lanthanum sputtering target is prepared, as described above, it becomes oxidized in a short period of time in the atmosphere. Generally speaking, a stable oxide layer is formed on a metal target surface, but since it is extremely thin under normal circumstances, it peels off during the initial stage of sputtering, and will not affect the sputtering characteristics significantly. However, with a lanthanum sputtering target, the oxide layer becomes thick and deteriorates the electrical conductivity, and thereby causes defective sputtering.

In addition, if the lanthanum sputtering target is left in the atmosphere for a long period of time, it reacts with the moisture in the air and becomes covered with white hydroxide powder, and ultimately becomes degraded, and it may even cause a problem of not allowing normal sputtering to be performed. Thus, after the target is prepared, it is necessary to take measures for preventing oxidation and hydration such as by immediately performing vacuum packing or coating the target with fats and oils.

As a method of storing rare earth metals, the standard method is to store the rare earth metals in mineral oil in order to prevent such rare earth metals from coming in contact with the atmosphere. However, when using a rare earth metal as a sputtering target, it is necessary to clean the target before its use in order to remove the mineral oil. However, there is a problem in that the cleaning of the target itself is difficult due to its reactivity with oxygen, moisture, and carbon dioxide.

Accordingly, under normal circumstances, it is necessary to store and pack the target based on vacuum packing. However, even in a state where the target is vacuum packed, since pulverization caused by hydroxylation will progress even with a small amount of moisture that permeates the film to be used, it was difficult to store the sputtering target for a long period of time in a usable condition.

When reviewing the conventional background art, there are the following methods; namely, a method of covering the hollow cathode-type sputtering target with a resin bag (refer to Patent Document 1), a method of affixing a plastic protective film to the target (refer to Patent Document 2), a method of packaging the target using a film having a surface that is free from detachable particles (refer to Patent Document 3), a method of using a transparent acrylic resin cover to prepare a target storage container and screwing shut the storage container (refer to Patent Document 4), and a method of filling the sputtering target in a bag-shaped object (refer to Patent Document 5). Nevertheless, since the foregoing Documents seal the target using a resin cover or a resin film, they are insufficient as a method of storing a target made of lanthanum oxide.

Moreover, there is a report that hydration can be inhibited by placing the lanthanum oxide powder in a hydrofluoric acid aqueous solution and forming a lanthanum fluoride film on the powder surface (refer to Patent Document 6). Although this is of some help, since its object is lanthanum oxide powder, it is unclear as to whether it can be applied to a target of bulk shape or block shape.

In light of the foregoing circumstances, the present applicant developed a method of storing a sputtering target made of lanthanum oxide, wherein the lanthanum oxide target and lanthanum oxide powder are charged in a vacuum pack with an oxygen transmission rate of 0.1 cm$^3$/m$^2$ per 24 h at 1 atm or less and a moisture vapor transmission rate of 0.1 g/m$^2$ per 24 h or less, and, after charging the target and powder, subjecting the vacuum pack to vacuum suction and sealing for storage (refer to Patent Document 7).

This storage method is extremely effective and yields a dramatically superior effect, in comparison to conventional technologies, of being able to inhibit the pulverization phenomenon caused by hydration (hydroxylation), and the pulverization phenomenon caused by the formation of carbonate. Nevertheless, it is necessary to further improve this storage method.

[Patent Document 1] Publication Number of WIPO: WO2005/037649
[Patent Document 2] Japanese Published Unexamined Application No. 2002-212718
[Patent Document 3] Japanese Published Unexamined Application No. 2001-240959
[Patent Document 4] Japanese Published Unexamined Application No. H8-246135
[Patent Document 5] Japanese Published Unexamined Application No. H4-231461
[Patent Document 6] Japanese Published Unexamined Application No. H10-87326
[Patent Document 7] Publication Number of WIPO: WO2010/050409
[Non Patent Document 1] Written by Eisuke Tokunaga and two others, "Research on Oxide Material for High-k Gate Insulator Film" The Institute of Electrical Engineers of Japan, Research Paper of Electronic Materials, Vol. 6-13, Pages 37 to 41, Published on Sep. 21, 2001

SUMMARY OF THE INVENTION

An object of this invention is to provide technology for enabling the long-term storage of a sputtering target in a usable state by devising the method of storing a target made of an oxide of lanthanum as a rare earth metal, and thereby inhibiting the pulverization phenomenon of the target caused by the hydration (hydroxylation) due to residual air or inclusion of air, and the pulverization phenomenon caused by the formation of carbonate.

Means for Solving the Problems

The present invention provides:
1) A method of storing a sputtering target made of lanthanum oxide, wherein a lanthanum fluoride film is formed in advance on a surface of the lanthanum oxide target to be stored, the lanthanum oxide target to which the lanthanum fluoride film was formed is charged in a vacuum pack with an oxygen transmission rate of 0.1 $cm^3/m^2$ per 24 h at 1 atm or less and a moisture vapor transmission rate of 0.1 $g/m^2$ per 24 h or less, and the vacuum pack is thereafter subject to vacuum suction and sealing for storage.

A significant feature of the present invention is to form a lanthanum fluoride film in advance on a surface of the lanthanum oxide target to be stored, and this considerably increases the effect of inhibiting the pulverization phenomenon of the target caused by hydration (hydroxylation), and the pulverization phenomenon caused by the formation of carbonate. Moreover, a more preferable condition of the vacuum pack is that it comprises properties where its oxygen transmission rate is 0.08 $cm^3/m^2$ per 24 h at 1 atm or less and its moisture vapor transmission rate is 0.02 $g/m^2$ per 24 h or less. The same applies to the vacuum pack explained below.

The present invention provides:
2) A method of storing a sputtering target made of lanthanum oxide, wherein a lanthanum fluoride film is formed in advance on a surface of the lanthanum oxide target to be stored, the lanthanum oxide target to which the lanthanum fluoride film was formed and lanthanum oxide powder are charged in a vacuum pack with an oxygen transmission rate of 0.1 $cm^3/m^2$ per 24 h at 1 atm or less and a moisture vapor transmission rate of 0.1 $g/m^2$ per 24 h or less, and the vacuum pack is thereafter subject to vacuum suction and sealing for storage.

The present invention provides:
3) The method of storing a lanthanum oxide target according to 1) or 2) above, wherein purity of the lanthanum oxide target is 3N or higher and content of C as a gas component is 100 wtppm or less.

The present invention provides:
4) A sputtering target made of lanthanum oxide sealed in a storage vacuum pack, wherein a lanthanum fluoride film is formed in advance on a surface of the lanthanum oxide target to be stored, the vacuum pack has an oxygen transmission rate of 0.1 $cm^3/m^2$ per 24 h at 1 atm or less and a moisture vapor transmission rate of 0.1 $g/m^2$ per 24 h or less, and the lanthanum oxide target to which the lanthanum fluoride film was formed is charged and sealed in the vacuum pack.

The present invention provides:
5) A sputtering target made of lanthanum oxide sealed in a storage vacuum pack, wherein a lanthanum fluoride film is formed in advance on a surface of the lanthanum oxide target to be stored, the vacuum pack has an oxygen transmission rate of 0.1 $cm^3/m^2$ per 24 h at 1 atm or less and a moisture vapor transmission rate of 0.1 $g/m^2$ per 24 h or less, and the lanthanum oxide target to which the lanthanum fluoride film was formed and lanthanum oxide powder are charged and sealed in the vacuum pack.

The present invention provides:
6) The sputtering target made of lanthanum oxide sealed in a storage vacuum pack according to 4) or 5) above, wherein purity of the lanthanum oxide target is 3N or higher and content of C as a gas component is 100 wtppm or less.

The present invention provides:
7) The sputtering target made of lanthanum oxide sealed in a storage vacuum pack according to any one of 4) to 6) above, wherein relative density of the sputtering target made of lanthanum oxide is 96% or more.

The present invention provides:
8) A thin film formed by sputtering the sputtering target made of lanthanum oxide sealed in a storage vacuum pack according to any one of 4) to 7) above after releasing the vacuum of the stored sputtering target made of lanthanum oxide and removing it from the storage vacuum pack.

Effect of the Invention

When sealing and storing a conventional target made of a rare earth metal or its oxide using a hermetic container or a plastic film, if it is left unattended for a long period of time, it will react with oxygen and moisture and become covered with white hydrate (hydroxide) powder, and there is a problem in that normal sputtering cannot be performed. Nevertheless, the sputtering target made of lanthanum oxide of the present invention in which a lanthanum fluoride film is formed in advance on a surface of the lanthanum oxide target to be stored, and then sealed in a vacuum pack and stored can be stored for a long period of time, and yields a significant effect of being able to avoid the foregoing problems.

DETAILED DESCRIPTION OF THE INVENTION

Lanthanum oxide is known to have extremely strong hygroscopic properties (reactivity with moisture, hydration). Thus, the challenge to date was how to prevent lanthanum and lanthanum oxide from absorbing moisture as much as possible, and how to store lanthanum oxide in an environment with minimal moisture.

The pulverization phenomenon of a conventional lanthanum oxide target and means for resolving this problem are now explained below with reference to diagrams and the like including specific examples and comparative examples.

In recent years, demands for a La-based target for use as a work function coordination layer ($La_2O_3$) of a PMOS high-k material are increasing. When La is stored in the atmosphere, it foremost changes to $La_2O_3$, and then rapidly changes to $La(OH)_3$, and ultimately deteriorates into powder form.

Figure 1:
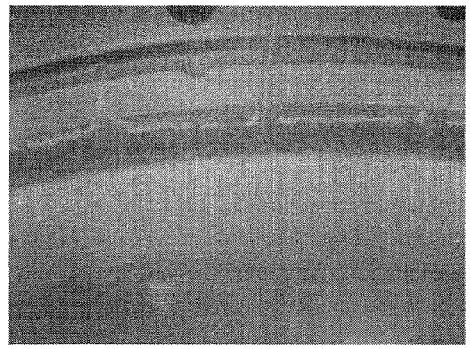
FIG. 1 is a diagram (photograph) showing, in a case of vacuum-packing a La oxide target, the state of the unopened target after the lapse of 4 months and the state of the same target after cleaning.
Figure 1:
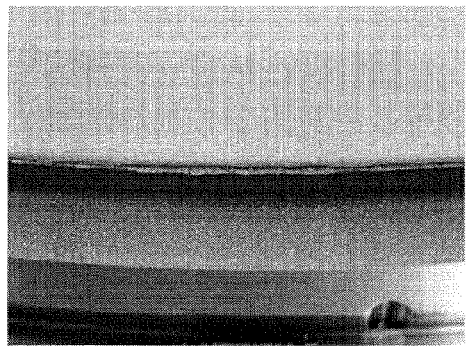

For example, if a $La_2O_3$ target is vacuum-packed and shipped to a customer, problems such as powdering, generation of numerous particles and crumbling of the outer circumferential part of the target would arise during the period from shipment to opening of the vacuum pack. FIG. 1 shows the condition thereof. The top diagram is a photograph showing the surface condition of an unopened target after 4 months have lapsed from shipment. Moreover, the bottom diagram is a photograph showing the surface condition of the target that was subject to surface cleaning after 4 months have lapsed from shipment.

As evident from the photographs, the edge portion of the target particularly shows the pulverization phenomenon. Although the surface condition can be recovered to some extent if such edge portion is removed by surface cleaning, there is a problem in that the target must be subject to surface cleaning with each use.

In order to resolve the foregoing problem, it is necessary to observe how hydration progresses, and to prevent the same.

Generally speaking, in order to produce a $La_2O_3$ target, $La_2O_3$ powder is hot pressed in a vacuum at a temperature of approximately 1300° C. In the foregoing case, the purity of the $La_2O_3$ powder is desirably high as possible in order to improve the purity of the target. The purity of the target needs to be at least a 3N level. As described above, in addition to the moisture in the air, carbon dioxide also forms carbonate and relates to the pulverization phenomenon. Accordingly, particular caution is required for the existence of carbon (C) in the target. Moreover, the density of the target also affects the pulverization phenomenon. This is because the existence of pores affects the hygroscopic property.

Figure 2:
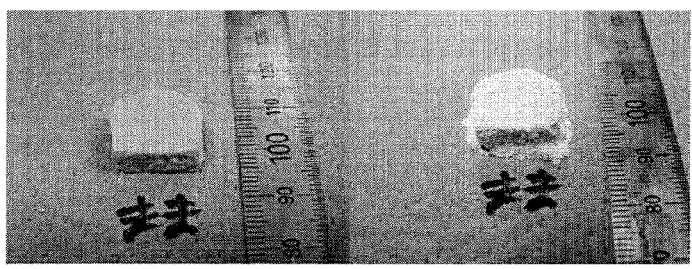
FIG. 2 is an exterior photograph showing the state immediately after removing the La oxide target from the vacuum pack and leaving it in the atmosphere for 2 days to 15 days.
Figure 2:
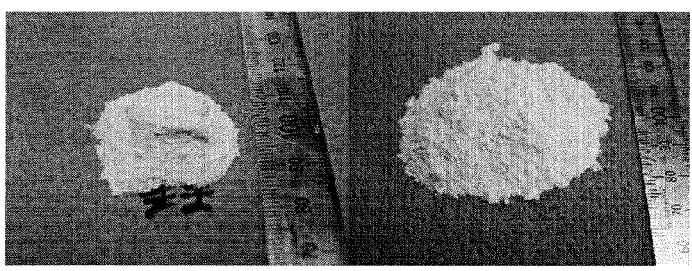

At what rate the hydration of the $La_2O_3$ target obtained by performing hot press in a vacuum advances was examined. FIG. 2 shows the exterior photographs upon leaving the $La_2O_3$ target in the atmosphere for 2 days to 15 days. Note that the experiment was conducted in June under an air-conditioned environment at room temperature of 23° C. with the air conditioner in the dehumidification mode.

On the following day, $La(OH)_3$ powder was formed on the surface, and became completely buried on day 3. The $La_2O_3$ target became completely powdered after 2 weeks. Based on the foregoing results, it was confirmed that the target needs to be completely shielded from air since the pulverization phenomenon advances severely in the atmosphere. Thus, a storage experiment was conducted using a vacuum pack (GX Barrier).

Figure 3:
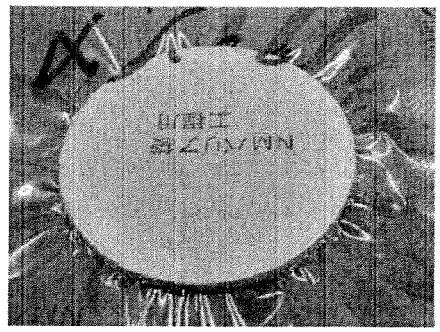
FIG. 3 is an exterior photograph after 2 weeks of storage using a vacuum pack (GX Barrier).

FIG. 3 is an exterior photograph after 2 weeks of storage upon placing the $La_2O_3$ target in a vacuum pack (GX Barrier). Although powder cannot be observed directly, it is evident that the color is gradually changing from gray to white. The XRD measurement results of the foregoing experiments are shown in FIG. 4.

Figure 4:
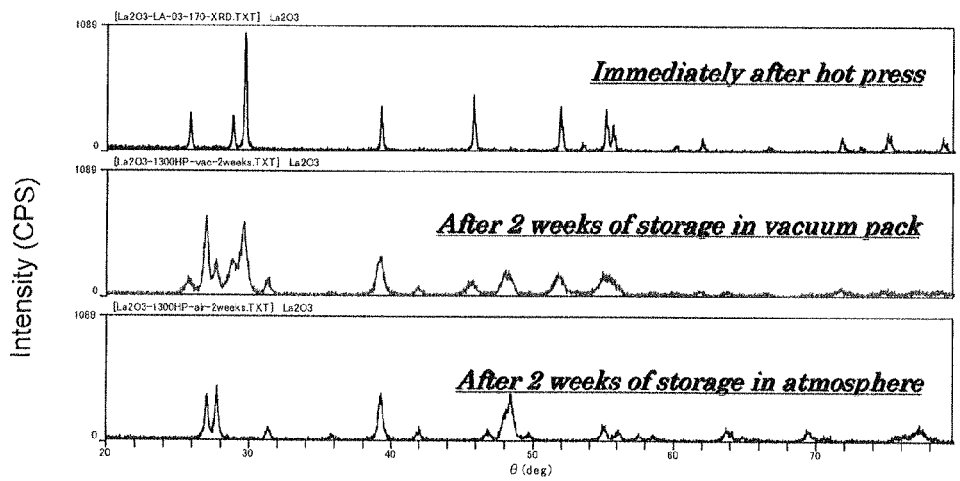
FIG. 4 is a diagram showing the XRD measurement results of the $La_2O_3$ target immediately after hot press, after 2 weeks of storage in a vacuum pack, and after 2 weeks of storage in the atmosphere, respectively.

The top row of FIG. 4 shows the XRD measurement results of the $La_2O_3$ target immediately after the hot press, the middle row shows the XRD measurement results of the $La_2O_3$ target after 2 weeks of storage in a vacuum pack, and the bottom row shows the XRD measurement results of the $La_2O_3$ target after 2 weeks of storage in the atmosphere.

Although it was a $La_2O_3$ single phase immediately after the hot press, hydration gradually advanced, and, 2 weeks later, the peak intensity ratio of $La_2O_3$ and $La(OH)_3$ (maximum intensity ratio of $La_2O_3$ and $La(OH)_3$ ((101) of $La_2O_3$ and (110) of $La(OH)_3$) became approximately 50:50, and half of the surface layer became $La(OH)_3$ even in the vacuum pack, and ultimately changed entirely to $La(OH)_3$ in the atmosphere. Although hydration can be delayed with a vacuum pack, it is evident that it cannot be prevented. Note that, upon the vacuum sealing and storage, it is desirable to perform vacuum sealing after once substituting the inside of the container or film-shaped seal with inert gas of a dew point minus 80° C. or lower. A flexible film is used as the means for sealing and storage, and this can be shaped into a sealed bag and used for vacuum sealing.

(Use of Dehumidifying Agent)

Figure 5:
FIG. 5 is a diagram showing the experiment of vacuum-packing silica gel, which is used as a dehumidifying agent, together with the target.
Figure 5:
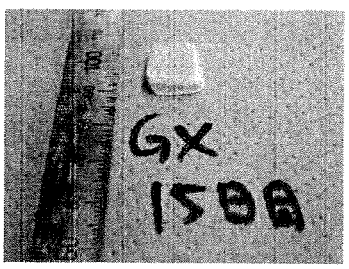

Since it was confirmed that storage only with a vacuum pack is insufficient based on the foregoing results, it was considered that the moisture permeating into the vacuum pack should be eliminated, and the use of a dehumidifying agent was examined. Foremost, an experiment was conducted by packing silica gel, which is generally used as a dehumidifying agent, together with the target. FIG. 5 shows the exterior photographs of day 1 and day 15 of storage.

In comparison to the case of using only a flexible film, the generation of $La(OH)_3$ increased when packing silica gel together with the target. This is considered to be because the grains are too large with a silica gel, causing many gaps to remain after the vacuum packing, and moisture that could not be exhausted remained in a considerable amount.

(Use of $La_2O_3$ Powder)

Figure 6:
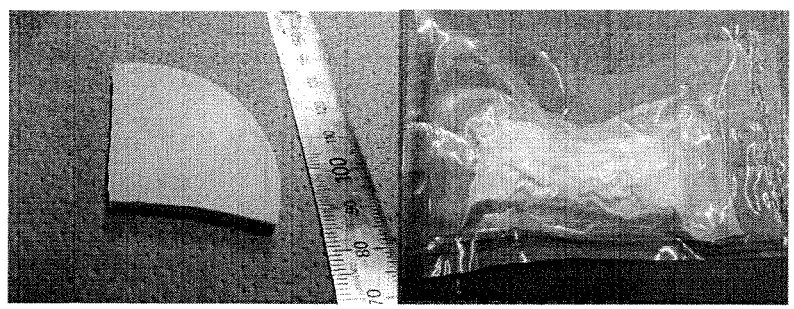
FIG. 6 is a diagram showing the results of using $La_2O_3$ powder as a dehumidifying agent.
Figure 6:
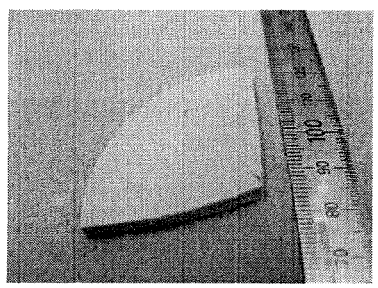

Thus, $La_2O_3$ powder was used as a material that will not cause any gaps even after the vacuum packing and which also has strong water absorbing power. Since $La_2O_3$ powder itself contains a large amount of moisture, the $La_2O_3$ powder was subject to degassing treatment in a vacuum furnace at 1000° C.×1.5 h. The photographs of the results of this experiment are shown in FIG. 6. The upper left photograph shows the storage results after 1 day of storage (before vacuum packing), the upper right photograph shows the state of using the $La_2O_3$ powder in a vacuum pack, and the bottom photograph shows the storage results after 1 month of storage.

Figure 7:
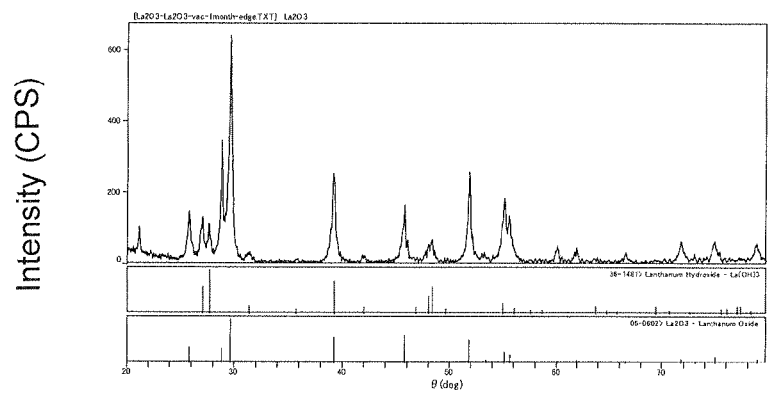
FIG. 7 is an X-ray diffraction image (XRD) of the target that was vacuum-packed together with $La_2O_3$ powder.

No discoloration can be observed on the surface even after the lapse of 1 month, and the X-ray diffraction image (XRD) of this target is shown in FIG. 7. Even when viewing the XRD of FIG. 7, the peak intensity ratio of $La_2O_3$ and $La(OH)_3$ (maximum intensity ratio of $La_2O_3$ and $La(OH)_3$ ((101) of $La_2O_3$ and (110) of $La(OH)_3$) is approximately 90:10, and hydrate decreased considerably in comparison to the case of only using a flexible film.

This is considered to be a result of using powder to eliminate gaps, and further using a material with high hygroscopic property. The storage period increased dramatically in comparison to the case of only using a flexible film.

Moreover, even if lanthanum oxide reacts with moisture and is subject to hydroxylation and pulverization and adheres to the target surface, since it is a compound of the same metal and since it is powder, it can be easily removed and will not cause a source of contamination. This point is a noteworthy advantage compared to cases of using a desiccant made from other metals.

As described above, contact with outside air is blocked and the inclusion of moisture in the outside air is inhibited as much as possible. Nevertheless, even if there is slight inclusion of outside air, hydroxylation of the target body can be inhibited by mounting or filling the foregoing lanthanum oxide to be used as the desiccant on or in the space that is created upon sealing the target.

Generally speaking, a target is bonded to a backing plate and, for instance, when using a flexible film in the form of a hermetic bag and performing vacuum sealing thereto, unevenness will inevitably arise between the target and the backing plate, and a gap is usually formed. Outside air is easily accumulated in such gap. Pulverization of the target tends to advance from such gap. Thus, it is desirable to fill the lanthanum oxide as the desiccant in such unevenness or gap.

In this respect, it should be easy to understand that the lanthanum oxide powder is preferably in the form of powder or grains with a large surface area. And, it is also effective to simply place a small piece of lanthanum oxide at a location where outside air is easily accumulated.

Moreover, although it is most effective to place the lanthanum oxide and the target to be in direct contact, adhesion of powder to the target surface may cause the generation of particles during sputtering. In the foregoing case, a sufficient effect can be yielded even by packing the powder in a permeable film as with a general desiccant and enclosing such permeable film.

Moreover, ironically, the foregoing lanthanum oxide powder to be used as the desiccant in the method of storing a target of the present invention that is most easily hydroxylated in the method of storing a target made of lanthanum oxide yields the greatest inhibition effect of hydroxylation of a target made of a rare earth metal or its oxide.

It is also important to keep the amount of moisture penetration of the flexible film or the amount of moisture inclusion of the container from the outside to be used in sealing and storing the target to be 0.1 $g/m^2$ per 24 h or less in order to prevent the inclusion of moisture as much as possible as the method of storing a target made of lanthanum oxide.

As a preferred example of a flexible film to be used as a vacuum pack with an oxygen transmission rate of 0.1 $cm^3/m^2$ per 24 h at 1 atm or less and a moisture vapor transmission rate of 0.1 $g/m^2$ per 24 h or less, those having properties of GX Barrier (product name) or higher are effective. GX Barrier (product name) and a bag containing Al foil are favorable. These are representative examples, and it goes without saying that other flexible films may be used so as long as they satisfy the foregoing conditions. The above has been presented by the present applicant in foregoing Patent Document 7.

(Surface Coating)

Although the foregoing method is effective, since the target is exposed to air for a long period of time during its production, powder is easily formed. Surface coating was performed as a countermeasure.

Foremost, easily accessible coating materials (paraffin and Teflon coating) that do not contain moisture were tested.

Moreover, since Patent Document 6 describes that the water resistance will improve if the surface is coated with a fluoride film based on treatment using hydrofluoric acid, hydrofluoric acid treatment was also tested. In the foregoing case, the target was dipped in hydrofluoric acid for 24 hours to form a $LaF_3$ film, which is stable in the atmosphere, on its surface, and stabilization in the atmosphere was thereby attempted. The results are shown below.

Figure 8:
FIG. 8 is a diagram showing the results of an experiment for confirming the pulverization phenomenon of the $La_2O_3$ target that was subject to paraffin coating.
Figure 9:
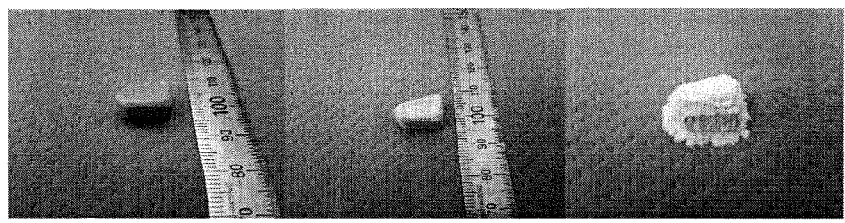
FIG. 9 is a diagram showing the results of an experiment for confirming the pulverization phenomenon of the $La_2O_3$ target that was subject to Teflon (registered trademark) coating.
Figure 10:
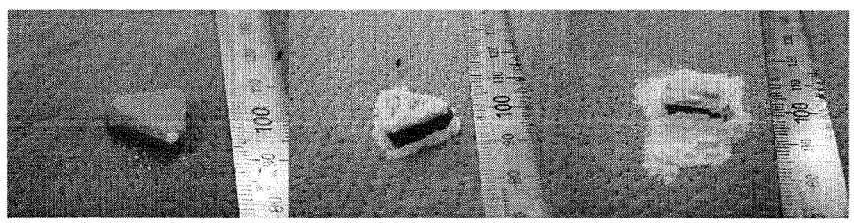
FIG. 10 is a diagram showing the results of an experiment for confirming the pulverization phenomenon of the $La_2O_3$ target that was subject to fluoride film coating.

FIG. 8 shows the results of the paraffin coating experiment, FIG. 9 shows the results of the Teflon coating experiment, and FIG. 10 shows the results of the fluoride film coating experiment.

All coatings were effective for 1 day, but powder was formed from day 2 onward. In all cases, powder had formed from the rough portions on the surface and edges where it is difficult to form the film.

With paraffin, powder immediately formed on the entire surface once $La(OH)_3$ generated from 1 location. This is considered to be because volume expansion occurred during hydration, and the film was unable to withstand such volume expansion. The wettability as inferior with Teflon spray, and powdering was the most significant among the three. Accordingly, it was considered that the use of only paraffin and Teflon spray will not lead to a fundamental solution. The same could be said for hydrofluoric acid treatment (formation of fluoride film).

This went against the facts described in Patent Document 6. However, since the method of Patent Document 6 was performed to $La_2O_3$ powder and the present invention conducted the test to a bulk $La_2O_3$ target, the shape of the objects was different, and it was unreasonable to expect the same results.

As described above, with the hydrofluoric acid treatment, it is assumed that the same phenomenon as paraffin occurred, but the formation of powder could not be observed in certain locations (especially on the side surface). Moreover, with the foregoing surface coating method, even though the storage period in the atmosphere can be extended, the extended period was 1 day, at the most.

However, it was anticipated that the storage period could be further extended by concurrently using the hydrofluoric acid treatment and vacuum packing. Thus, after the hydrofluoric acid treatment, the target was vacuum-packed and stored for additional testing.

(Concurrent Use of Fluoride Film Coating and Vacuum Pack)

Figure 11:
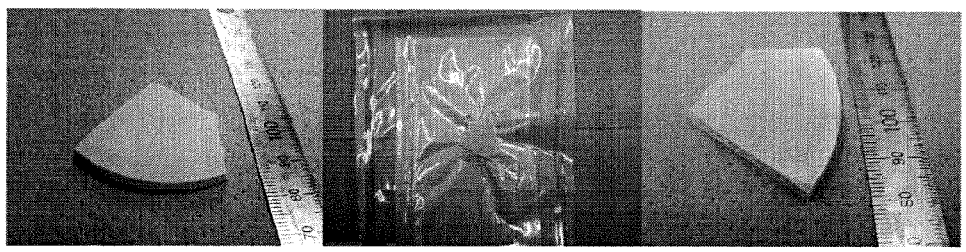
FIG. 11 is a diagram showing the results of transition of the pulverization phenomenon upon concurrently using the fluoride film coating and vacuum pack for the $La_2O_3$ target.

The results of the transition of the pulverization phenomenon in the case of concurrently using the fluoride film coating and vacuum packing for the $La_2O_3$ target; that is, the photographs of the pulverization transition of the $La_2O_3$ target are shown in FIG. 11.

Figure 12:
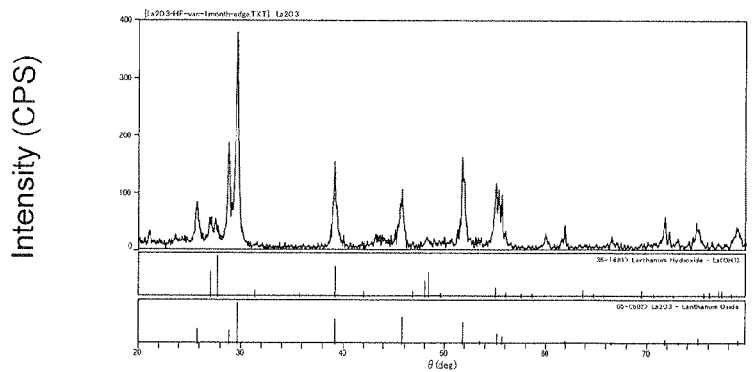
FIG. 12 is a diagram showing the analysis of the X-ray diffraction of the $La_2O_3$ target upon concurrently using the fluoride film coating and vacuum pack.

Moreover, the X-ray diffraction experimental results of the $La_2O_3$ target in the foregoing case are shown in FIG. 12.

Accordingly, as a result of increasing the moisture resistance by providing a fluoride film and subjecting the target to vacuum storage, hydration hardly advanced even after the lapse of 1 month. The maximum peak intensity ratio of $La_2O_3$ and $La(OH)_3$ ((101) of $La_2O_3$ and (110) of $La(OH)_3$) was approximately 90:10 (note that it was approximately 45:55 in cases of using only a vacuum pack).

(Concurrent Use of Fluoride Film Coating, Vacuum Pack and $La_2O_3$ Powder as Dehumidifying Material)

In light of the foregoing experimental results, the surface coating with hydrofluoric acid and $La_2O_3$ as the dehumidifying material which were effective in extending the storage period were used upon storing the target in a vacuum pack in the experiment.

Figure 13:
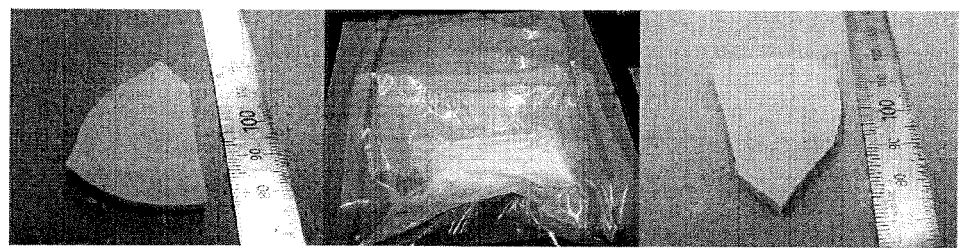
FIG. 13 is a diagram showing the results of transition of the pulverization phenomenon of the $La_2O_3$ target upon concurrently using the fluoride film coating, vacuum pack and $La_2O_3$ powder as the dehumidifying material.
Figure 14:
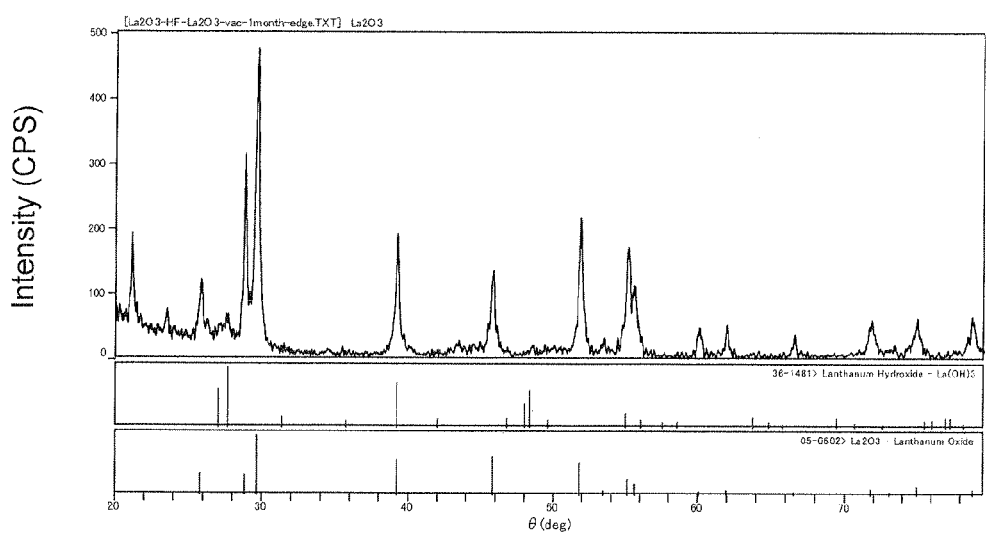
FIG. 14 is a diagram showing the analysis based on X-ray diffraction of the $La_2O_3$ target upon concurrently using the fluoride film coating, vacuum pack and $La_2O_3$ powder as the dehumidifying material.

The transition of the pulverization phenomenon of the target is shown in FIG. 13. Moreover, the X-ray diffraction experimental results of the $La_2O_3$ target in the foregoing case are shown in FIG. 14.

As shown in FIG. 13, by concurrently using the fluoride film coating, $La_2O_3$ powder, and vacuum pack which were effective in extending the storage period, hardly any change was observed in the $La_2O_3$ target even after 1 month. Moreover, as shown in FIG. 14, the peak intensity ratio of $La_2O_3$ and $La(OH)_3$ ((101) of $La_2O_3$ and (110) of $La(OH)_3$) was approximately 98:2.

A $La_2O_3$ sintered compact target reacted with moisture in the air an easily changed to $La(OH)_3$. Although the storage period could be extended by blocking the contact with outside air using a vacuum pack, dehumidifying the inside of the vacuum pack, and providing surface coating, it was not possible to completely prevent hydration. Nevertheless, as a result of concurrently using these methods, hardly any change could be observed in the target even after the storage of 1 month, and a significant improvement effect was confirmed.

Conventionally, if a rare earth metal oxide sputtering target, particularly a lanthanum oxide sputtering target is left in the atmosphere for a long period of time, it reacts with the moisture in the air and becomes covered with white hydroxide powder, and there is a problem in that normal sputtering cannot be performed. Nevertheless, the method of storing a target made of lanthanum oxide of the present invention is able to avoid the foregoing problems.

With the method of storing a sputtering target made of lanthanum oxide according to the present invention, basically, a lanthanum oxide target to which a lanthanum fluoride film was formed and lanthanum oxide powder are charged in a vacuum pack, and, after charging the target and the powder, the vacuum pack is subject to vacuum suction and sealing for storage. It is thereby possible to effectively inhibit the condition where the target reacts with the moisture in the atmosphere and becomes covered with white hydroxide powder.

Accordingly, targets can be stably supplied as an electronic material such as a metal gate material or a high-dielectric material (High-k), and the present invention is extremely useful industrially.

The invention claimed is:

1. A method of storing a sputtering target made of lanthanum oxide, wherein a lanthanum fluoride film is formed in advance on the surface of the lanthanum oxide target to be stored by applying hydrofluoric acid treatment to the lanthanum oxide target, the lanthanum oxide target to which the lanthanum fluoride film was formed and lanthanum oxide powder are placed into a container, and the container is thereafter subject to vacuum suction and sealing to form a vacuum-sealed package which has an oxygen transmission rate of 0.1 $cm^3/m^2$ per 24 h at 1 atm or less and a moisture vapor transmission rate of 0.1 $g/m^2$ per 24 h or less, wherein the lanthanum oxide target has a purity of 3N (99.9%) or higher and a content of C as a gas component of 100 or less.

2. A vacuum sealed package comprising a sputtering target, the sputtering target having a lanthanum fluoride film formed on the surface of the lanthanum oxide target in advance of being placed within the vacuum-sealed package, the lanthanum oxide target residing within the vacuum-sealed package with a separate supply of lanthanum oxide powder, and the vacuum-sealed package having an oxygen transmission rate of 0.1 $cm^3/m^2$ per 24 h at 1 atm or less and a moisture vapor transmission rate of 0.1 $g/m^2$ per 24 h or less, wherein the lanthanum fluoride film is a $LaF_3$ film formed by applying hydrofluoric acid treatment to the lanthanum oxide target.

3. The vacuum sealed package according to claim 2, wherein the lanthanum oxide target has a purity of 3N (99.9%) or higher and a content of C as a gas component of 100 wtppm or less.

4. The vacuum sealed package according to claim 3, wherein the lanthanum oxide target is has a relative density of 96% or more.

5. A thin film formed by sputtering the sputtering target made of lanthanum oxide according to claim 2 after releasing the lanthanum oxide target from the vacuum-sealed package and removing therefrom the lanthanum oxide powder.

6. The vacuum sealed package according to claim 2, wherein the lanthanum oxide target is has a relative density of 96% or more.

7. The method according to claim 1, wherein the hydrofluoric acid treatment comprises the step of dipping the lanthanum oxide target in hydrofluoric acid for a time sufficient for forming a $LaF_3$ film on the surface of the lanthanum oxide target.

8. A method of storing a lanthanum oxide sputtering target, comprising the steps of:

applying hydrofluoric acid treatment to a lanthanum oxide sputtering target to produce a surface coating of a lanthanum fluoride film on the lanthanum oxide sputtering target;

after said applying step, placing the lanthanum oxide sputtering target and a separate supply of lanthanum oxide powder into a package;

after said placing step, subjecting the package to vacuum suction and sealing to form a vacuum-sealed package in which the separate supply of lanthanum oxide powder and the lanthanum oxide sputtering target having the surface coating of the lanthanum fluoride film are stored, the vacuum-sealed package having an oxygen transmission rate of 0.1 $cm^3/m^2$ per 24 h at 1 atm or less and a moisture vapor transmission rate of 0.1 $g/m^2$ per 24 h or less.

9. The method according to claim 8, wherein the hydrofluoric acid treatment comprises the step of dipping the lanthanum oxide sputtering target in hydrofluoric acid.

10. The vacuum sealed package according to claim 2, wherein, with the exception of the lanthanum fluoride film, the sputtering target consists of lanthanum oxide.

11. The vacuum sealed package according to claim 2, wherein, with the exception of the lanthanum fluoride film, the sputtering target consists of lanthanum oxide.

* * * * *